(12) United States Patent
Ouderkirk et al.

(10) Patent No.: US 7,404,756 B2
(45) Date of Patent: Jul. 29, 2008

(54) PROCESS FOR MANUFACTURING OPTICAL AND SEMICONDUCTOR ELEMENTS

(75) Inventors: Andrew J. Ouderkirk, Woodbury, MN (US); Paul S. Lugg, Woodbury, MN (US); Olester Benson, Jr., Woodbury, MN (US); Catherine A. Leatherdale, Saint Paul, MN (US); William D. Joseph, Maplewood, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 10/977,239

(22) Filed: Oct. 29, 2004

(65) Prior Publication Data

US 2006/0094340 A1 May 4, 2006

(51) Int. Cl.
*B24B 1/00* (2006.01)

(52) U.S. Cl. .......................................... 451/57; 451/41

(58) Field of Classification Search ............. 451/41–44, 451/57, 58, 28, 63, 69, 70; 65/37, 61, 181
See application file for complete search history.

(56) References Cited

U.S. PATENT DOCUMENTS

| | | | |
|---|---|---|---|
| 2,865,082 A | 12/1958 | Gates | |
| 3,187,606 A | 6/1965 | Ohntrup | |
| 3,254,558 A | 6/1966 | Staunton | |
| 3,383,760 A | 5/1968 | Shwartzman | |
| 4,198,788 A * | 4/1980 | Fleetwood et al. | 451/41 |
| 4,637,370 A | 1/1987 | Ishizuka | |
| 5,107,626 A | 4/1992 | Mucci | |
| 5,117,592 A | 6/1992 | Preston | |
| 5,265,381 A | 11/1993 | Takahashi | |
| 5,270,423 A | 12/1993 | Brown et al. | |
| 5,379,554 A * | 1/1995 | Thurman et al. | 451/177 |
| 5,698,452 A | 12/1997 | Goossen | |
| 5,733,178 A | 3/1998 | Ohishi | |
| 5,752,874 A | 5/1998 | Meyer, Jr. et al. | |
| 5,915,193 A | 6/1999 | Tong et al. | |
| 5,919,561 A | 7/1999 | Fuchs et al. | |
| 5,925,898 A | 7/1999 | Spath | |
| 5,958,794 A | 9/1999 | Bruxvoort et al. | |
| 5,989,111 A * | 11/1999 | Lamphere et al. | 451/526 |
| 6,243,199 B1 | 6/2001 | Hansen et al. | |

(Continued)

FOREIGN PATENT DOCUMENTS

EP    1 080 836    3/2001

(Continued)

OTHER PUBLICATIONS

Q. Y. Tong, "Semiconductor Wafer Bonding", John Wiley & Sons, New York, 1999, Table of Contents, pp. 49-101, and pp. 223-232.

(Continued)

*Primary Examiner*—Dung Van Nguyen
(74) *Attorney, Agent, or Firm*—Scott A. Bardell

(57) ABSTRACT

A method for fabricating an array of precisely shaped and located shaped elements utilizes a precisely shaped patterned abrasive to form channels in a workpiece. One or more patterned abrasives contact and abrade along one or more intersecting axes to define the shaped elements. The shaped elements may include optical elements, semiconductor elements, or both.

32 Claims, 7 Drawing Sheets

U.S. PATENT DOCUMENTS

| | | |
|---|---|---|
| 6,412,971 B1 | 7/2002 | Wojnarowski et al. |
| 6,475,398 B2 | 11/2002 | Kitahata |
| 6,495,862 B1 | 12/2002 | Okazaki et al. |
| 6,563,133 B1 | 5/2003 | Tong |
| 6,634,929 B1 * | 10/2003 | Visser .................. 451/41 |
| 6,671,443 B2 | 12/2003 | Deliwala |
| 7,008,080 B2 | 3/2006 | Bachl et al. |
| 2002/0141006 A1 | 10/2002 | Pocius et al. |
| 2003/0024169 A1 | 2/2003 | Kendall et al. |
| 2003/0227678 A1 | 12/2003 | Lines et al. |
| 2003/0231497 A1 | 12/2003 | Sakata et al. |
| 2004/0012957 A1 | 1/2004 | Bachi et al. |
| 2004/0036080 A1 | 2/2004 | Bogner et al. |
| 2004/0046179 A1 | 3/2004 | Baur et al. |

FOREIGN PATENT DOCUMENTS

| | | |
|---|---|---|
| JP | 10-151549 | 6/1998 |
| WO | WO 01/18570 | 3/2001 |
| WO | 01/41219 | 6/2001 |
| WO | 01-41225 | 6/2001 |
| WO | WO 01/45903 | 6/2001 |

OTHER PUBLICATIONS

U.S. Application entitled "Process for Manufacturing a Light Emitting Array", filed on, Oct. 29, 2004, having U.S. Appl. No. 10/977,240.

IBM Technical Bulletin, vol. 15, NN7206147, "Method of Making Hemispheres", Jun. 1972, pp. 147-148.

* cited by examiner

PROCESS FOR MANUFACTURING OPTICAL AND SEMICONDUCTOR ELEMENTS

CROSS REFERENCE TO RELATED APPLICATIONS

The present application relates generally to co-filed and commonly assigned U.S. patent application "Process For Manufacturing A Light Emitting Array", Ser. No. 10/977, 240.

BACKGROUND

The present invention relates to a process for manufacturing an array of shaped elements, such as optical elements and semiconductor elements.

Optical elements (i.e. shaped bodies of inorganic or organic material and faceted along at least one plane, the shaped bodies reflecting, refracting, and absorbing light and/or conducting heat) and semiconductor elements having at least one dimension of less than a few millimeters are currently fabricated by a number of processes. These processes include molding, lapping individual elements, casting the optical elements from a sol-gel followed by sintering, microreplication, and processes using surface tension or shrinkage to form desired shapes. Of these processes, only lapping allows the production of precise shapes from refractory or crystalline materials. However, lapping is one of the slowest and most expensive processes for producing a large number of optical elements, especially for ceramics with high thermal conductivity, such as diamond, silicon carbide, and sapphire. In addition, individually lapped shaped elements must be handled individually, which is difficult.

BRIEF SUMMARY

The present application discloses methods of manufacturing shaped elements from a workpiece, where the workpiece is abraded to at least partially form channels that define an array of shaped elements. Surfaces of the channels are polished to optical quality with a patterned abrasive.

DETAILED DESCRIPTION OF THE ILLUSTRATIVE EMBODIMENTS

Figure 1A:
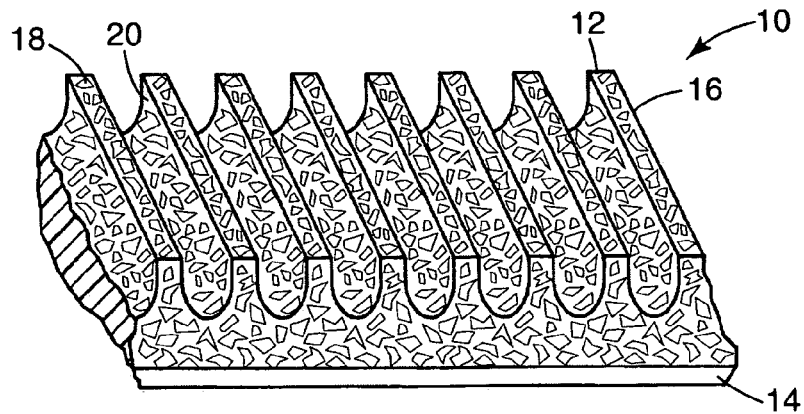
FIGS. 1a and 1b are perspective views of representative embodiments of patterned abrasives.
Figure 1B:
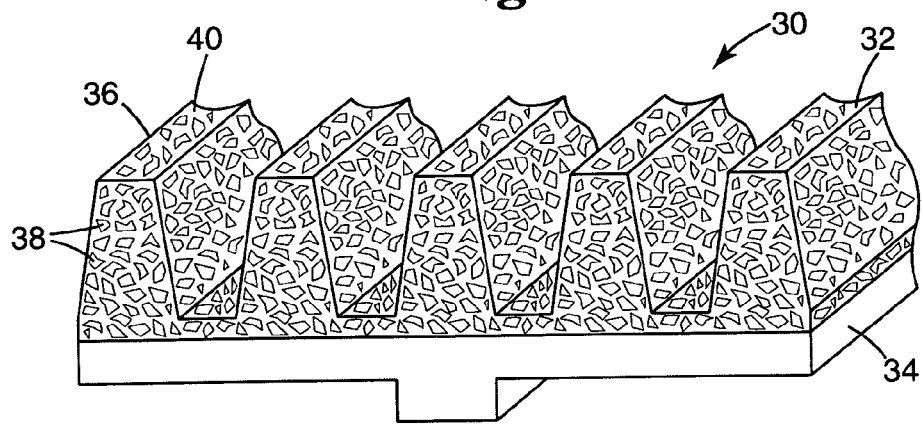

FIGS. 1a and 1b show representative embodiments of patterned abrasive 10, 30 for abrading substrate material to form an array of individual optical and/or semiconductor elements. As used herein, abrading may include abrading and polishing substrate material simultaneously, however, polishing may occur as a separate step. In addition, as used herein in regard to elements or shaped elements, "individual" and "singulated" refers to elements that are identifiable units but that are not necessarily detached from other elements. Likewise, singulating refers to forming identifiable units, which are not necessarily detached from one another. As shown, patterned abrasives 10, 30 include working surfaces 12, 32 and backings 14, 34. Working surfaces 12, 32 include protrusions 16, 36, particles 18, 38, and binders 20, 40.

Patterned abrasive 10, 30 is formed by applying a composite of particles 18, 38 dispersed in binder 20, 40 to backing 14, 34. Backing 14, 34 may be materials such as polyethylene terephthalate (PET) film, cloth, paper, non-wovens, metal foil, fiberglass, and combinations thereof. Binder 20, 40 serves as a medium for dispersing particles 18, 38 and may also bond the composite to backing 14, 34. Patterned abrasive 10, 30 is formed into precise three-dimensional shapes by molding the composite.

The typical molding operation involves forming the composite, or resin, in a mold, which is subsequently cured with an energy source such as ultraviolet light, electrons, x-rays, or thermal energy. Alternatively, the composite can be formed while in a plastic state and cured to form the desired shape. For example, a phenolic binder filled with particles may be molded with a molding tool and cured with radiation or heat. Significantly, patterned abrasive 10, 30 can be made to precise specifications.

Trizact™ abrasives, made by 3M Company, is an example of a patterned abrasive. Suitable patterned abrasives include abrasive particles and a binder. Binder material is formed of polymers, metals, or ceramics. Some examples include urethanes, epoxies, acrylated urethanes, acrylated epoxies, mono- and poly-functional acrylates, phenolics, electroformed nickel, and glass-type material.

Particles 18, 38 have an average diameter from about 0.5 to about 20 µm, or in some embodiments, from about 1.5 to about 10 µm. Particles 18, 38 can include fused aluminum oxide (which includes brown, heat treated, and white aluminum oxide), ceramic aluminum oxide, green silicon carbide, silicon carbide, silica, chromia, fused alumina:zirconia, diamond, iron oxide, ceria, cubic boron nitride, boron carbide, garnet, and combinations thereof. Other adjuvant, such as processing aids, may be included to modify and improve abrading performance.

Particles 18, 38 may be mixed directly into a binder, or they may first be formed into abrasive agglomerates prior to mixing into a binder. To form abrasive agglomerates, particles are bound in a glass-type material, such as silica or silicate glass, to improve cutting performance. The abrasive agglomerates are then mixed into a binder.

Protrusions 16, 36 of patterned abrasive 10, 30 may be formed into any of a number of shapes. Examples include protrusions 16, 36 with cross-sections taken perpendicular to the abrasion path that are circular and non-circular arcs including aspherical arcs, trapezoids, parabolas, pyramids, and combinations thereof. The cross-section of the individual optical and/or semiconductor elements has the inverse cross-section of protrusions 16, 36 taken perpendicular to the path of patterned abrasive 10, 30. In addition, the individual optical and/or semiconductor elements are faceted along at least one plane with more complex cross-sectional shapes potentially creating more complex facets on the shaped elements.

Unlike patterned abrasive 10, 30, conventional abrasives are normally used to produce a smooth planar surface. To minimize groove formation, the pitch of (spacing between) the abrasive peaks is randomized, or the peaks are oriented at canted angles relative to the sanding motion, and the abrasive is oscillated during sanding. Alternatively, peaks of conventional abrasives are shallow with nonspecific shapes and involve one lapping step.

Patterned abrasives 10, 30 are also distinguishable from conventional gang saws. Gang saws are multiple rows of metal blades mechanically aligned and individually attached. The metal blades dull with use. Patterned abrasives are monolithic rows of composite materials precisely aligned and manufactured from a die, mold, or other techniques, and, unlike gang saws, can be formulated to erode and sharpen with use and to have multiple functions and utilities. As described above, patterned abrasives can simultaneously abrade and polish. This feature results in less damage to the shaped elements than other methods including cutting with gang saws. Patterned abrasives may also include grinding aids, filler particles, particle surface treatments, surfactants, passivation agents, oxidizing agents, coupling agents, dispersants, and other additives. Examples of these materials are described in U.S. Pub. No. 2003/0024169 A1 (Kendall et al.).

Figure 2A:
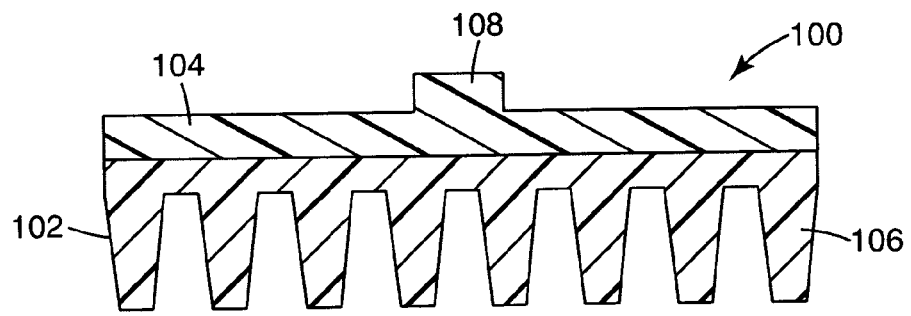
FIGS. 2a–2d are cross-sectional views illustrating a first embodiment of the process of manufacturing shaped elements.

FIGS. 2a–2d illustrate the process of forming precise individual elements from a precisely formed patterned abrasive. FIG. 2a shows patterned abrasive 100 with working surface 102 and backing 104. Working surface 102 includes protrusions 106, and backing 104 includes fiducial reference 108.

In use, patterned abrasive 100 is utilized through any of a number of tools to abrade substrate material to form individual optical and/or semiconductor elements. Patterned abrasive 100 may be applied to at least a portion of a rotatable cylinder, a belt, or a flat sheet to create a tool for the abrading process.

Figure 2B:
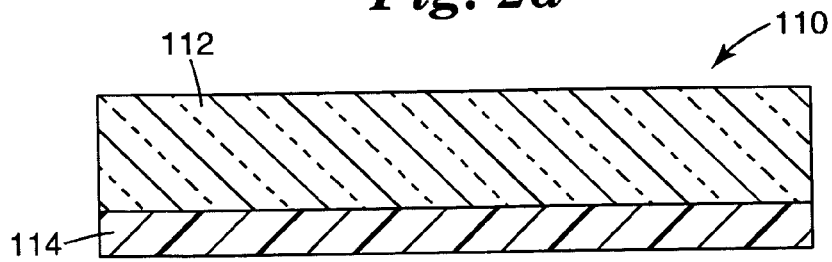

FIG. 2b shows workpiece 110 made of optical and/or semiconductor material. Workpiece 110 includes substrate material 112 and carrier 114. Suitable substrate materials include optical materials such as hard inorganic material like glasses, calcite, sapphire, zinc oxide, silicon carbide, diamond, and combinations thereof. Optical materials may also include laminates of these materials, for example, silicon carbide bonded to glass, sapphire bonded to glass, calcite bonded to glass, and polymer films bonded to glass. Advantageous characteristics of optical materials include a thermal diffusivity of at least 0.01 cm2/s, transparency, a high refractive index, low color, and low toxicity. Substrate material 112 may also comprise semiconductor material such as silicon or semiconductors deposited on silicon carbide or sapphire. Though substrate material 112 may be composed of any type of optical and/or semiconductor material, abrading and polishing with patterned abrasive 100 is particularly advantageous for fragile, extremely hard, and/or temperature sensitive materials—materials that are very difficult to cut using conventional methods and are non-moldable.

Carrier 114 may be comprised of any of a number of materials well known in the art. Suitable materials should be very mechanically stable.

In operation, working surface 102 of patterned abrasive 100 contacts substrate material 112 of workpiece 110. Workpiece 110 is abraded by either a continuous motion or an oscillating motion to at least partially form channels in workpiece 110 and polish surfaces of the elements defined by the channels to optical quality. The relative motion between patterned abrasive 100 and workpiece 110 is perpendicular to the cross-sectional plane of the illustration. Abrasion may be performed dry or with a liquid lubricant and cooling agent. If a liquid lubricant is utilized, an abrasive slurry containing one of the particle types previously described may be added. Abrasive slurries (commonly used in chemical mechanical polishing (CMP)) are known in the art. For example, an aqueous based complex suspension containing silica, alumina, or ceria abrasive particles, and chemical additives such as oxidizers, polymers, pH stabilizers, dispersants, and surfactants can be used in combination with a conformable polishing pad. Suitable polishing fluids provide increased reactivity or corrosivity at the point of particle contact or interaction with a protrusion. Different temperatures may be used to control the reactivity or corrosivity of the polishing fluid. Alternatively, patterned abrasive 100 is formed by an abrasive-free pad used in combination with an abrasive slurry. The abrasive-free pad defines the shape of the channels, while the abrasive slurry polishes surfaces of the channels to optical quality.

Surfaces of the elements can be polished using any of a number of conventional polishing techniques, including both loose and fixed abrasive polishing. In loose abrasive polishing, slurries of abrasive minerals ($CeO_2$, $SiO_2$, $Al_2O_3$, diamond, or the like) are combined with a solvent (typically water) and applied to a pad or platen material. The material substrate to be polished is moved relative to the pad or platen material under a normal load while the abrasive slurry is delivered to the pad-substrate interface. Typical pad materials are porous polymers such as urethanes, felts, cloths, or napped polymeric materials. In fixed abrasive polishing, the abrasive minerals are held rigidly in a bond material that can be a resin, metallic, or vitreous (glass). In this situation, the substrate or material to be polished is again moved relative to the pad or platen material under a normal load. A polishing liquid can be applied to the fixed abrasive-substrate interface to aid in polishing. Types of polishing liquids can be either aqueous or non-aqueous liquids at a pH designed to assist in material removal. Slurries of abrasive particles can also be used with fixed abrasives to provide polishing action. Both fixed abrasives and polishing pads for loose abrasive polishing come in a variety of mechanical configurations and properties designed to produce an appropriate balance of material removal, surface finish, and large scale topography form retention.

Figure 2C:
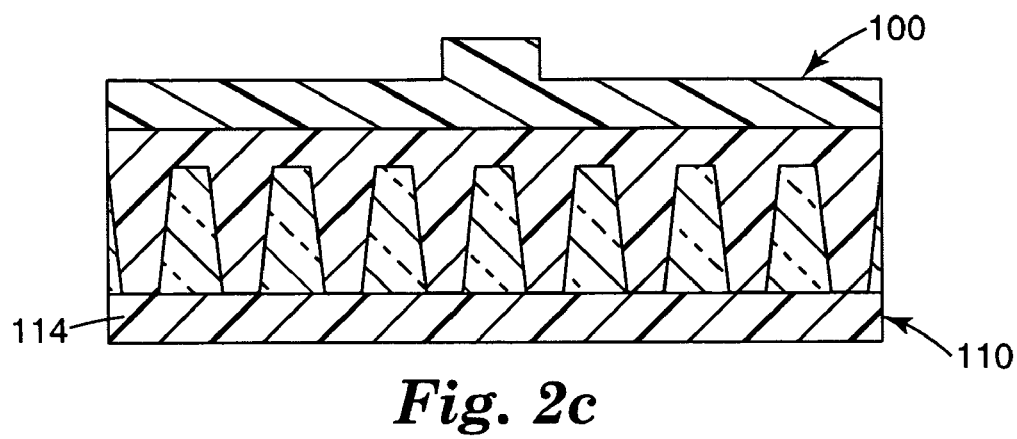

FIG. 2c illustrates patterned abrasive 100 and workpiece 110 during the abrading process. To abrade, forces should be exerted on backing 104 opposite working surface 102 and on carrier 114 opposite substrate 112 to keep patterned abrasive 100 and substrate 112 in contact during the abrading process. These forces are exerted through either a firm material, a compliant material (for example, rubber), or through a fluid such as an air or liquid bearing surface.

Figure 2D:
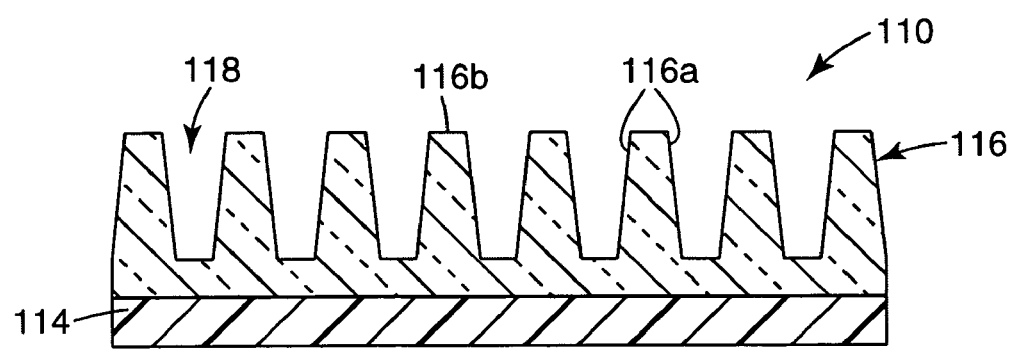

FIG. 2d shows workpiece 110 with individual elements 116 and channels 118. Each individual element 116 includes side surfaces 116a and top surface 116b. Abrading may be by forming channels 118 and polishing some or all of side surfaces 116a and top surface 116b simultaneously or progressively with one or more patterned abrasives forming channels 118 and then polishing surfaces 116a and 116b. If performed simultaneously, the abrading rate is sufficiently fast to polish surfaces 116a and 116b to optical quality. If performed progressively, a progression of two or more patterned abrasives is used with each abrasive becoming increasingly finer during the process, or an abrasive slurry may be added where the particles are increasingly finer throughout the process.

Patterned abrasive 100 can also be prepared with distinctly different sized particles distributed or concentrated in particular portions of protrusions 106. For example, large particles may be incorporated into the tips of protrusions 106 to provide high removal rates and a coarse finish on elements 116. Finer particles may be concentrated at the sides of protrusions 106 to polish side surfaces 116a of elements 116. The land, which is the surface between each protrusion 106 of patterned abrasive 100, may incorporate a different particle size that abrades top surface 116b of workpiece 110 if elements 116 have a height nearly equal to protrusions 106. An example of a patterned abrasive with multifunctional regions is described in PCT Publication No. WO 01/45903 A1 (Ohishi).

FIGS. 3a–3f show an alternative method. Here, a diamond saw or similar type tool is used to roughly form the channels, which are then finished with one or more patterned abrasives.

Figure 3A:
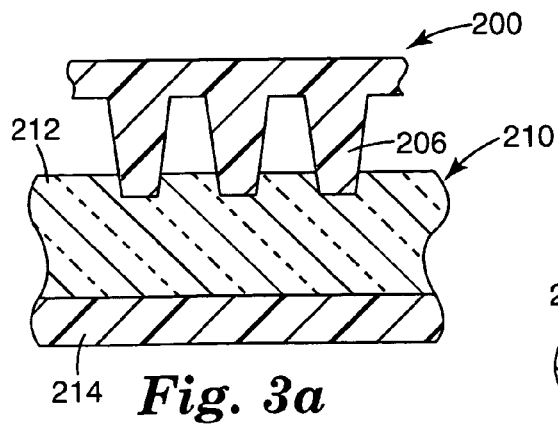
FIGS. 3a–3f are cross-sectional views showing a second embodiment of the process of manufacturing shaped elements.

FIG. 3a includes patterned abrasive 200 with protrusions 206 and workpiece 210 with substrate material 212 and carrier 214. In operation, workpiece 210 is abraded with patterned abrasive 200 such that protrusions 206 only partially form channels.

Figure 3B:
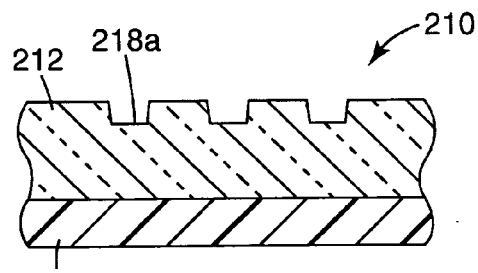

The result of the step of FIG. 3a is shown in FIG. 3b. Workpiece 210 now includes partially formed channels 218a.

Figure 3C:
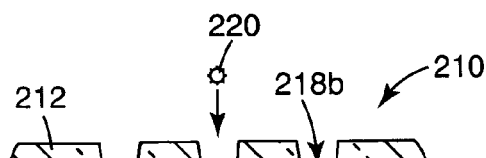
Figure 3D:
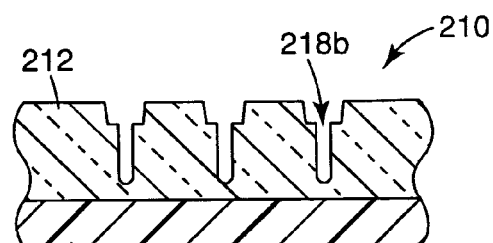

Next, as shown in FIG. 3c, diamond saw 220 uses partially formed channels 218a as a guide for further forming channels. Diamond saw 220 cuts each channel 218a individually to form partially formed channels 218b. Using partially formed channels 218a ensures that diamond saw 220 cuts each channel 218b in the proper location. FIG. 3d shows workpiece 210 after formation of each partially formed channel 218b. Though shown cutting nearly through substrate 212, diamond saw 220 may also form partially formed channels 218b by completely cutting through substrate 212.

Figure 3E:
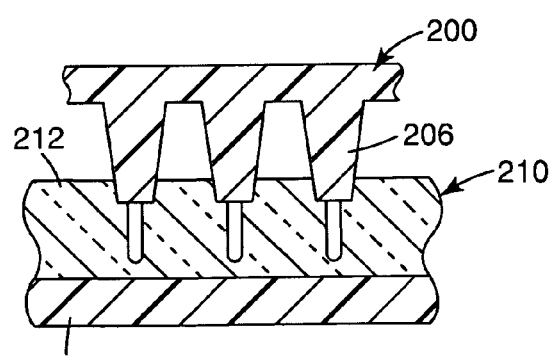

To finish forming the channels, patterned abrasive 200 abrades workpiece 210 to define channels 218 and form elements 216. This is illustrated in FIG. 3e. Patterned abrasive 200 may be the same patterned abrasive that was utilized initially or a different patterned abrasive. Further polishing can be accomplished using the CMP and fixed abrasive techniques described above.

Figure 3F:
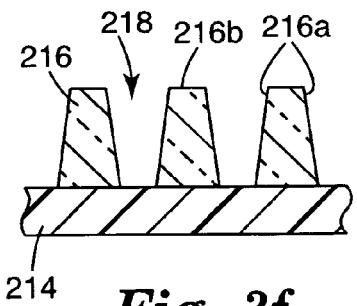

Individual elements 216 are shown attached to carrier 214 in FIG. 3f. Patterned abrasive 200 polished at least some of surfaces 216a and 216b to optical quality.

Substrate 212 may be completely abraded through or the abrasion can be stopped before abrading completely through. If abrasion is stopped before completely abrading through substrate 212, the resulting array of shaped elements can be singulated by back grinding the remainder of the backside of substrate 212.

This creates a second plane of facets as viewed from the backside of the singulated shaped elements.

Figure 4A:
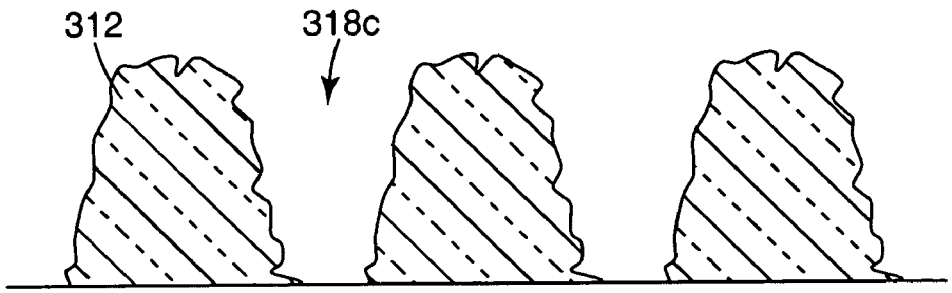
FIGS. 4a–4c are cross-sectional views showing a third embodiment of the process of manufacturing shaped elements.
Figure 4B:
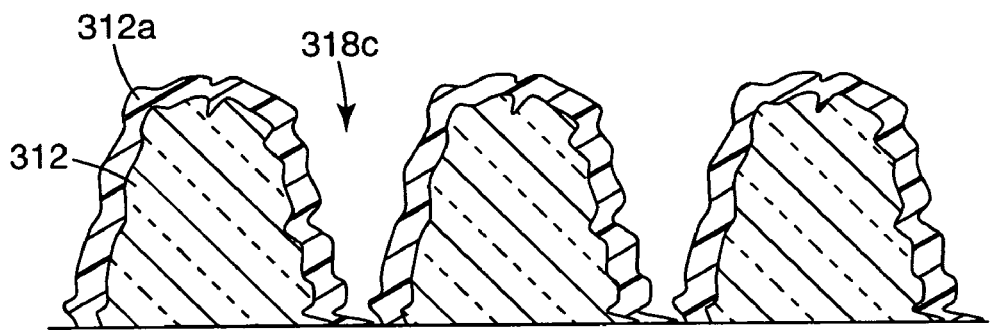
Figure 4C:
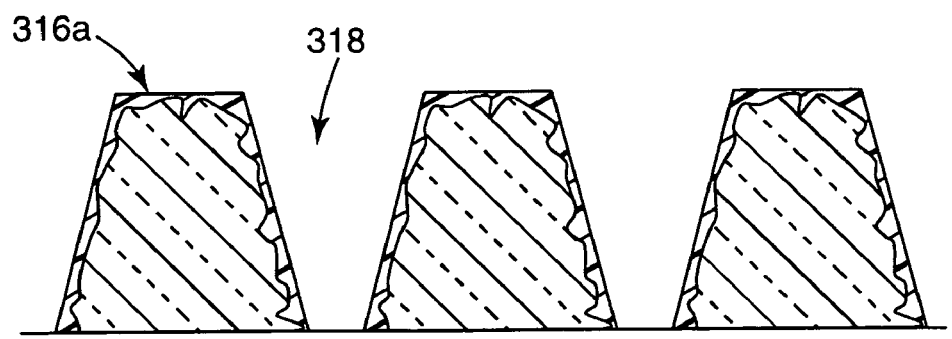

FIGS. 4a–4c illustrate an alternate method. FIG. 4a shows substrate 312 with rough channels 318c. Substrate 312 may be abraded or cut by any of the methods previously described or others well known in the art.

As shown in FIG. 4b, conformal coating 312a, which is a soft, easily polished material, is deposited onto the roughly shaped substrate 312 material using techniques such as chemical vapor deposition or sputtering. Coating 312a may be silica, silicate glass, or indium tin oxide and should cover all of the partially formed elements. The patterned abrasive then abrades coating 312a to form channels 318 and polishes surfaces of channels 318 to optical quality. FIG. 4c shows the resulting product, elements 316a.

In yet another alternate method, (not illustrated) the patterned abrasive is initially used to plunge cut the substrate on the workpiece to form partially formed channels. Then, either the same or another patterned abrasive abrades the side surfaces of the partially formed channels by urging the patterned abrasive laterally against the surfaces of the partially formed channels. Channels that result from this method are wider than the protrusions of the patterned abrasive.

The individual elements may be singulated such that they are utilized as an array or such that they are utilized individually. If used individually, the carrier may be releasable to singulate the shaped elements through its removal.

Figure 5:
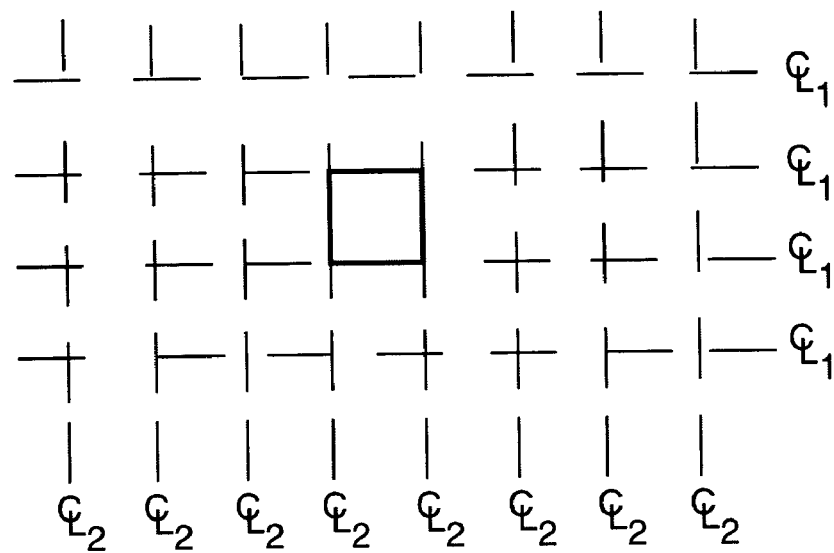
FIGS. 5 and 6 are diagrams illustrating channel formation.
Figure 6:
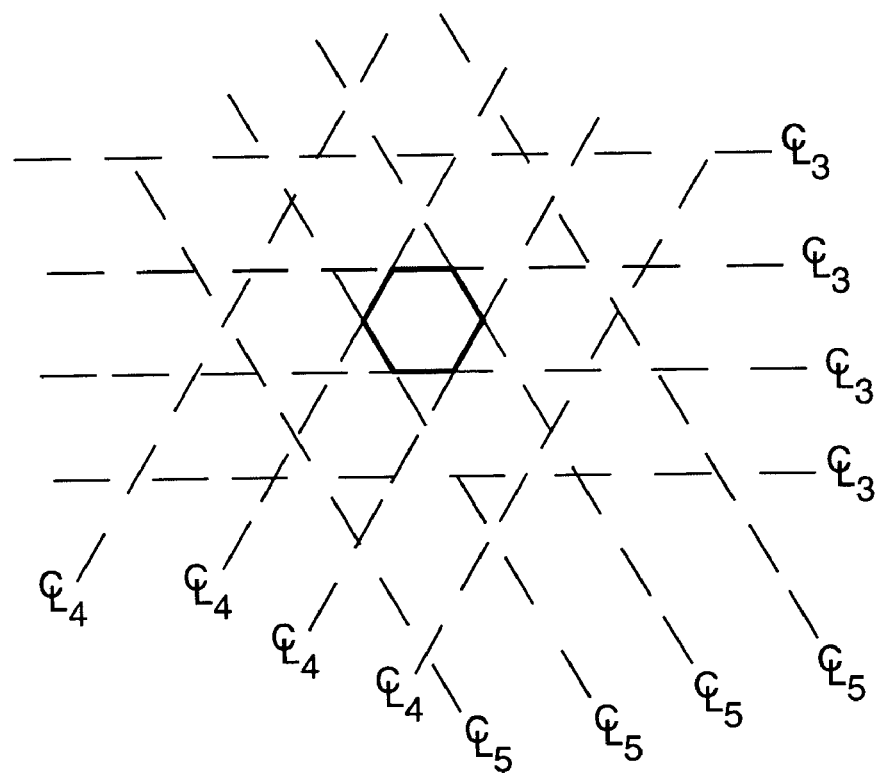

The shaped elements can be formed such that the base of each element has a particular desired shape and the shaped elements are faceted. The shapes and facets are formed by abrading the workpiece along one or more intersecting axes. FIGS. 5 and 6 illustrate this concept.

FIG. 5 illustrates the formation of elements having a square base (shown in bold). FIG. 5 shows center lines CL1 and center lines CL2, which represent the center line of channels formed in the workpiece. Abrading along center line CL1, rotating the workpiece relative to the patterned abrasive by about 90°, and abrading along center line CL2, produces elements having square bases.

FIG. 6 illustrates the formation of elements having a hexagonal base (shown in bold). FIG. 6 shows center lines CL3, center lines CL4, and center lines CL5. Here, the relative rotation is about 60° between the three abrasion steps. With this process, shaped elements having three or more facets can be formed, with shaped elements having from three to eight facets being easily made. Directional abrasion along each additional axis creates more complex facets on the shaped elements.

Paths of the channels may be either linear, as shown in FIGS. 5 and 6, or curved. A plurality of curved intersecting paths may be formed or gently curved arcs or sinusoidal curves such that bodies of revolution are not formed.

Additionally, the channels may be formed by an interleaving process. In this method, a plurality of first channels is formed in a workpiece with a patterned abrasive. The patterned abrasive is lifted, laterally moved a distance, and set down to form a plurality of second channels that are parallel to, but offset from, the first channels such that the first and second channels are interleaved. A different patterned abrasive may be used to form the second channels if desired. This process is continued using one or more patterned abrasives until the desired number of channels is achieved.

The height of each element is a matter of design choice but typically measures up to about 10 mm, more typically from about 300 μm to about 4 mm. The base width of each element measures about one-tenth to about one-half of the height, and the distance between each element measures about one-half the height. Aspect ratios of the shaped elements are typically 2:1 or 5:1. Elements made of transparent optical material can have a tapered shape as shown, to collimate or focus light. In some embodiments, however, it may be useful to create individual elements with vertical or nearly vertical side surfaces.

In order to fabricate precise individual elements, the patterned abrasive should be accurately positioned against the workpiece to abrade along each axis necessary to form the desired shape. This may be carried out by any of a number of methods. As shown in FIG. 2a, patterned abrasive 100 includes fiducial reference 108, which fits into a guide of a tool to position and hold patterned abrasive 100 in place during abrasion. A fiducial reference, such as one or more protrusions 106, may be on working surface 102. Fiducial references may be mechanical, using guides, or provide signals to a control mechanism that controls placement. A control mechanism dynamically adjusts the position of patterned abrasive 100, workpiece 110, or both. Control mechanisms may utilize optical, mechanical, electrical, or magnetic signals.

Alternatively, a roller and one or two side walls may be used as an edge guide for a tool with a belt. The side walls define the position of the edges of the belt.

Figure 7A:
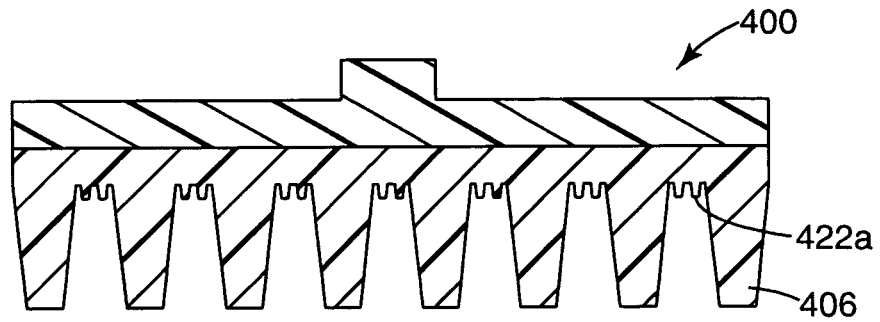
FIGS. 7a–7c are cross-sectional views showing a representative process of manufacturing an array of optical elements.
Figure 7B:
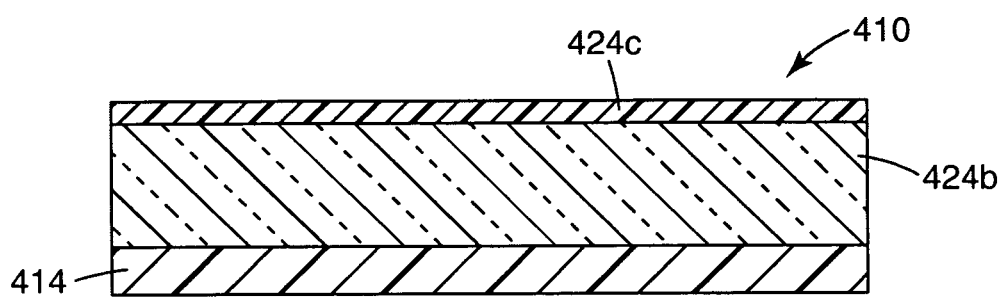
Figure 7C:
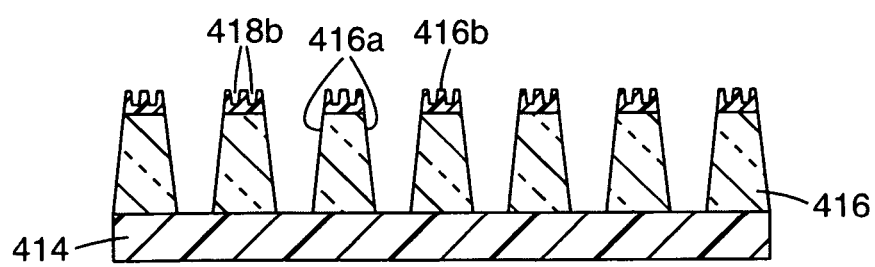

An array of optical elements may be bonded to singulated light sources such as light emitting diode (LED) die. However, because the individual optical elements produced by the disclosed processes are in precise locations defining an array, the array of optical elements is ideal for alignment with an array of LED dies where either or both of the optical elements and dies are fixed to a releasable carrier. FIGS. 7a–7c illustrate another process of manufacturing an array of optical elements that may be bonded to an array of LED dies.

FIG. 7a shows patterned abrasive 400 with protrusions 406 and protrusions 422a. FIG. 7b shows workpiece 410 with optical materials 424b and 424c and carrier 414. Here, workpiece 410 illustrates the use of multiple layers of optical material. For example, layer 424b may be glass, ceramic, or polymers. Suitable polymers include thermosetting, thermoplastic, and oriented thermoplastic polymers. Suitable materials for layer 424c include glass, ceramic, or polymers, as well as other optical materials such as multilayer optical film mirrors or polarizers, inorganic layers including metals, indium tin oxide, zinc oxide, metal meshes, grids, networks, and wire-grid polarizers. Wire-grid polarizers are described in U.S. Pat. No. 6,243,199 (Hansen et al.) and U.S. Patent Application No. 2003/0227678 (Lines et al.). The wire-grid polarizer may optionally be covered with a protective coating.

FIG. 7c shows optical elements 416 formed from the abrading process. Optical elements 416 include side surfaces 416a and top surface 416b with channels 418b. As shown, protrusions 422a of patterned abrasive 400 form channels 418b in top surface 416b, which aid in attachment of LEDs. Patterned abrasive 400 has polished surfaces 416a and 416b to optical quality, preferably having a surface roughness $R_A$ of about 20 nm.

In some embodiments, LED dies that are attached to optical elements 416 are arranged into an array prior to bonding with optical elements 416. This process is illustrated in FIGS. 8a–8d.

In a related approach, a two- or more layered workpiece such as that shown in FIG. 7b can comprise a semiconductor wafer bonded to a second wafer composed of an optical material such as those described above. The semiconductor wafer can include a substrate, electrode layers, and semiconductor layers suitable for generating light via electroluminescence. The LEDs formed in the semiconductor wafer can have a "flip chip" design, where both electrodes can be accessed from one side of the wafer. The opposite side of the semiconductor wafer, corresponding to the emitting surfaces of the LEDs within the wafer, is bonded to the layer of optical material. Conventional bonding methods can be used as described elsewhere herein. The semiconductor/optical combination workpiece can then be abraded with any of the patterned abrasives disclosed herein, e.g., that of FIG. 1b. If desired, electrode layers of the semiconductor wafer, if present, can be protected with a thin layer of polymer or other material during the abrading process. Such polymer or other material can later be removed using heat, plasma etching, or a suitable solvent. Abrasion can be initiated from one or both sides of the combination workpiece. If initiated from the semiconductor wafer side, and if tapered protrusions such as those of FIG. 1b are used to cut channels between the LEDs within the wafer, then when the abrasion procedure is complete the end result is a multitude of individual LED die/optical element pairs, securely bonded to each other and intrinsically aligned, but without having to individually align or mount small individual optical elements bonded to small individual LED dies.

Figure 8A:
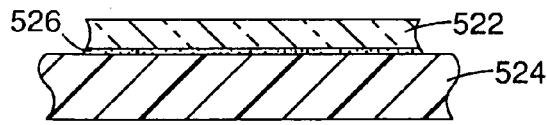
FIGS. 8a–8d are cross-sectional views showing a representative process of manufacturing and attaching an array of LED dies to optical elements.

FIG. 8a shows substrate 522 attached to carrier 524 by adhesive 526. In this example, substrate 522 is a wafer of semiconductor material and carrier 524 is releasable.

Figure 8B:
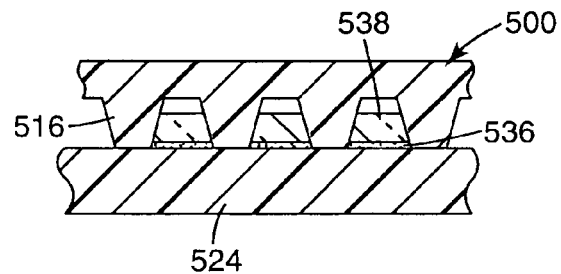

Patterned abrasive 500 abrades substrate 522 to form channels that define LED dies. As shown in FIG. 8b, the thickness of substrate 522 is less than the height of protrusions 516. In order to relieve stress on substrate 522 in abrading steps subsequent to the first abrading step, the channels may be backfilled with a suitable material that is subsequently degraded or washed away after the final abrading step. Suitable materials are rigid, polymeric materials that are soluble, burnable, or photodegradable. This backfilling technique may also be utilized with any of the embodiments described.

Figure 8C:
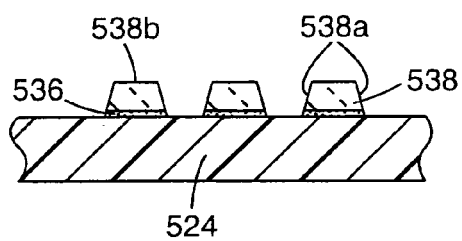

Resulting LED dies 538, with side surfaces 538a and top surfaces 538b, attached to carrier 524 are shown in FIG. 8c. Dicing a wafer of semiconductor material using patterned abrasive 500 simultaneously polishes side surfaces 538a to optical quality, thus decreasing time and cost associated with dicing wafers. In addition, current methods of dicing wafers result in a significant percentage of dies being chipped. The disclosed abrasive processes result in fewer chipped dies, which is another significant cost savings. A further advantage of dicing a wafer across a large portion of the surface is that the dicer speed is much less dependent on the dimension of the completed die. For example, singulating a large wafer into very small die can be very time consuming using conventional dicing techniques.

Figure 8D:
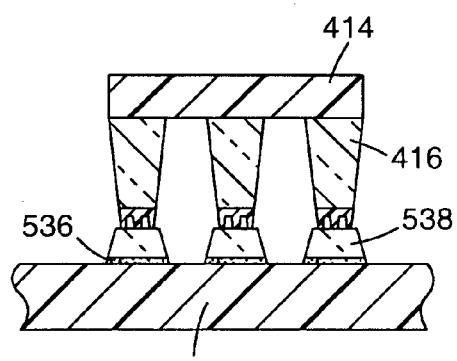

The array of optical elements 416 (FIG. 7c) is then attached to the array of LED dies 538. As shown in FIG. 8d, optical elements 416 are paired, one-to-one, with LED dies 538. The paired optical elements and LED dies may be utilized as an array or individually. Each combination of optical element 416 and LED die 538 can be singulated either by removing carriers 414 and 524 or by cutting through carriers 414 and 524.

In an alternate method, substrate 522 is laminated over substrates 424b and 424c (FIG. 7b). The patterned abrasive abrades through all or some or substrates 522, 424c, and 424b. Thus, an array of optical elements bonded to LEDs is formed without having to align optical and semiconductor elements to each other and without having to perform separate abrading steps.

Figure 9:
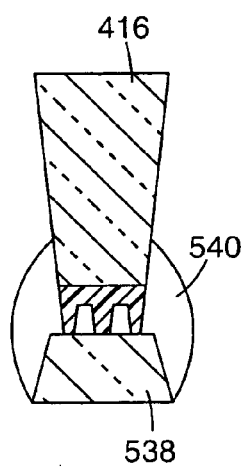
FIGS. 9 and 10 are cross-sectional views showing representative embodiments of bonding an optical element to a LED die.

Dies 538 may be bonded to optical elements 416 by any of a number of methods. FIG. 9 illustrates one form of bonding. FIG. 9 shows a singulated pairing of optical element 416 and LED die 538. Curable resin 540 encases die 538 and optical element 416 to bond the pairing together.

Figure 10:
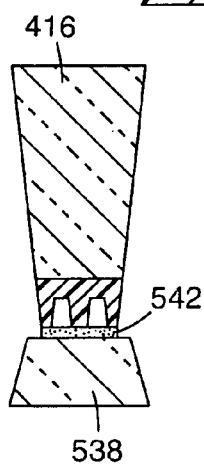

Alternatively, as shown in FIG. 10, hot melt adhesive 542 is applied between optical element 416 and LED die 538. Examples of suitable hot melt adhesives include semicrystalline polyolefins, thermoplastic polyesters, and acrylic resins.

In other embodiments, surface 538b of die 538, surface 416 of optical element 416, or both is coated with a thin plasma assisted or conventional CVD process of silica or other inorganic material. This is followed by planarization and bonding with a combination of heat, pressure, water, or other chemical agents. Bondability can also be improved by bombarding at least one of the surfaces with hydrogen ions. In addition, semiconductor wafer bonding techniques such as those described by Q. -Y. Tong and U. Gösele, in chapters 4 and 10 of *Semiconductor Wafer Bonding*, John Wiley & Sons, New York, 1999 may be used. Other wafer bonding methods are described in U.S. Pat. No. 5,915,193 (Tong et al.) and U.S. Pat. No. 6,563,133 (Tong).

The disclosed processes of manufacturing or finishing optical elements and semiconductors, result in simultaneously producing an array of precisely located elements of optical quality. Bonding or coupling the optical elements to a light source, such as an LED, both collimates light from the LED and conducts heat away from the LED. The resulting process is efficient and produces a high quality product.

The references cited herein are incorporated by reference. Although the present invention has been described with reference to preferred embodiments, workers skilled in the art will recognize that changes may be made in form and detail without departing from the spirit and scope of the invention.

What is claimed is:

1. A method of manufacturing shaped elements from a workpiece, the method comprising:
   abrading a workpiece to at least partially form channels that define an array of shaped elements, wherein the workpiece comprises optical material, semiconductor material, or a combination thereof; and
   polishing surfaces of parallel channels simultaneously with at least one patterned abrasive having a working surface with a pattern of protrusions, the at least one patterned abrasive comprising at least one particle type and binder.

2. The method of claim 1, wherein the channels have tapered side surfaces.

3. The method of claim 1, wherein the channels have side surfaces polished to optical quality.

4. The method of claim 1, wherein the workpiece comprises:
   a substrate; and
   a carrier.

5. The method of claim 1, wherein the workpiece comprises optical material, and the shaped elements comprise optical elements.

6. The method of claim 5, wherein the optical material is selected from the following: glasses, calcite, sapphire, zinc oxide, silicon carbide, diamond, polymer films, and combinations thereof.

7. The method of claim 1, wherein an abrasive slurry is utilized in polishing.

8. The method of claim 1, wherein abrading is performed with a cutting element.

9. The method of claim 8, wherein the cutting element is a patterned abrasive.

10. A method of manufacturing shaped elements from a workpiece, the method comprising:
    abrading a workpiece to at least partially form channels that define an array of shaped elements; and
    polishing surfaces of parallel channels simultaneously with at least one patterned abrasive having a working surface with a pattern of protrusions;
    wherein the workpiece comprises optical material, and the shaped elements comprise optical elements; and
    wherein the optical material includes a plurality of layers of optical material.

11. A method of manufacturing shaped elements from a workpiece, the method comprising:
    abrading a workpiece to at least partially form channels that define an array of shaped elements; and
    polishing surfaces of parallel channels simultaneously with at least one patterned abrasive having a working surface with a pattern of protrusions;
    wherein the workpiece comprises optical material, and the shaped elements comprise optical elements; and
    wherein the optical material has a thermal diffusivity of at least 0.01 cm$^2$/s.

12. The method of claim 1, wherein cross-sections of the protrusions include at least one of circular arcs, noncircular arcs, trapezoids, parabolas, pyramids, and combinations thereof.

13. A method of manufacturing shaped elements from a workpiece, the method comprising:
    abrading a workpiece to at least partially form channels that define an array of shaped elements, wherein the workpiece comprises optical material, semiconductor material, or a combination thereof; and
    polishing surfaces of parallel channels simultaneously with at least one patterned abrasive having a working surface with a pattern of protrusions; wherein abrading further comprises:
    at least partially forming channels along a plurality of intersecting axes.

14. A method of manufacturing shaped elements from a workpiece, the method comprising:
    abrading a workpiece to at least partially form channels that define an array of shaped elements, wherein the workpiece comprises optical material, semiconductor material, or a combination thereof; and
    polishing surfaces of parallel channels simultaneously with at least one patterned abrasive having a working surface with a pattern of protrusions;
    wherein the shaped elements have at least one dimension of less than about 10 mm.

15. A method of manufacturing shaped elements from a workpiece, the method comprising:
    abrading a workpiece to at least partially form channels that define an array of shaped elements; and
    polishing surfaces of parallel channels simultaneously with at least one patterned abrasive having a working surface with a pattern of protrusions;
    wherein the workpiece comprises semiconductor material.

16. The method of claim 15, wherein the semiconductor material is selected from the following: silicon, semiconductors deposited on silicon carbide, and semiconductors deposited on sapphire.

17. The method of claim 15, wherein the shaped elements are light emitting devices.

18. A method of manufacturing shaped elements from a workpiece, the model comprising:
    abrading a workpiece to at least partially form channels that define an array of shaped elements; and
    polishing surfaces of parallel channels simultaneously with at least one patterned abrasive having a working surface with a pattern of protrusions;
    wherein the workpiece comprises a wafer containing an array of undivided diodes.

19. A method of manufacturing shaped elements from a workpiece, the method comprising:
    abrading a workpiece to at least partially form channels that define an array of shaped elements, wherein the workpiece comprises optical material, semiconductor material, or a combination thereof;
    polishing surfaces of parallel channels simultaneously with at least one patterned abrasive having a working surface with a pattern of protrusions; and
    singulating the shaped elements.

20. A method of manufacturing shaped elements from a workpiece, the method comprising:

abrading a workpiece to at least partially form channels that define an array of shaped elements; and polishing surfaces of parallel channels simultaneously with at least one patterned abrasive having a working surface with a pattern of protrusions;

wherein abrading is performed with a cutting element; and wherein the cutting element is a diamond saw.

21. A method of manufacturing shaped elements from a workpiece, the method comprising:

abrading a workpiece to at least partially form channels that define an array of shaped elements; and polishing surfaces of parallel channels simultaneously with at least one patterned abrasive having a working surface with a pattern of protrusions;

wherein abrading further comprises:

starting channels with patterned abrasive;

removing workpiece material in started channels with a saw; and further removing workpiece material with patterned abrasive to define channels.

22. A method of manufacturing at least one shaped element from a workpiece, the method comprising:

abrading a workpiece to at least partially form channels that define the at least one shaped element, wherein the workpiece comprises optical material, semiconductor material, or a combination thereof; and polishing surfaces of the channels simultaneously with at least one patterned abrasive having a working surface with a pattern of protrusions, the patterned abrasive further comprising at least one particle type and binder.

23. The method of claim 22, wherein the abrading is performed with the patterned abrasive.

24. The method of claim 23, wherein the abrading and the polishing further comprise an oscillating motion between the patterned abrasive and the workpiece.

25. The method of claim 22, wherein the polishing is performed with a plurality of patterned abrasives.

26. A method of manufacturing at least one shaped element from a workpiece, the method comprising:

abrading a workpiece to at least partially form channels that define the at least one shaped element; and polishing surfaces of the channels simultaneously with at least one patterned abrasive having a working surface with a pattern of protrusions;

wherein the abrading is performed with the patterned abrasive; and wherein the abrading and the polishing further comprise a continuous motion between the patterned abrasive and the workpiece.

27. A method of manufacturing an array of shaped elements, the method comprising:

abrading a workpiece with at least one patterned abrasive to form channels that define an array of shaped elements, the patterned abrasive having a working surface with a pattern of protrusions; and polishing surfaces of channels with the patterned abrasive;

wherein the abrading and the polishing are simultaneous.

28. The method of claim 27, wherein the workpiece is comprised of optical material.

29. The method of claim 28, wherein the optical material is selected from the following: glasses, calcite, sapphire, silicon carbide, diamond, polymer films, and combinations thereof.

30. The method of claim 27, wherein the workpiece is comprised of semiconductor material.

31. The method of claim 27, wherein an abrasive slurry is utilized in the abrading and the polishing.

32. The method of claim 27, wherein a liquid lubricant and cooling agent are utilized in the abrading and the polishing.

\* \* \* \* \*

UNITED STATES PATENT AND TRADEMARK OFFICE
CERTIFICATE OF CORRECTION

| | | |
|---|---|---|
| PATENT NO. | : 7,404,756 B2 | Page 1 of 1 |
| APPLICATION NO. | : 10/977239 | |
| DATED | : July 29, 2008 | |
| INVENTOR(S) | : Andrew J. Ouderkirk | |

It is certified that error appears in the above-identified patent and that said Letters Patent is hereby corrected as shown below:

Title Page
Item [56], References cited, U.S. PATENT DOCUMENTS, Below "Sakata et al." delete "Bachi et al." and insert -- Bachl et al. --, therefor.

Column 3
Line 49, Delete "cm2/s" and insert -- $cm^2/s$ --, therefor.

Column 4
Line 24, Delete "CeO2, SiO2, Al2O3" and insert -- $CeO_2$, $SiO_2$, $Al_2O_3$ --, therefor.

Column 5
Line 50, Delete "This creates a second plane of facts as viewed from the backside of the singulated shaped elements." and insert the same on Line 49 as a continuation of the same paragraph.

Column 8
Line 43, After "or some" delete "or" and insert -- of --, therefor.
Line 66, After "Q." delete "-Y." and insert -- Y. --, therefor.

Column 10
Line 48, In Claim 18, delete "model" and insert -- method --, therefor.

Column 12
Line 6, In Claim 26, after "one shaped" delete "elements;" and insert -- element, wherein the workpiece comprises optical material, semiconductor material, or a combination thereof; --, therefor.

Signed and Sealed this

Twenty-eighth Day of October, 2008

JON W. DUDAS
*Director of the United States Patent and Trademark Office*